US012704794B2

(12) United States Patent
Sakata

(10) Patent No.: US 12,704,794 B2
(45) Date of Patent: Aug. 11, 2026

(54) IMPRINTING METHOD, IMPRINT APPARATUS AND ARTICLE MANUFACTURING METHOD

(71) Applicant: CANON KABUSHIKI KAISHA, Tokyo (JP)

(72) Inventor: Yuji Sakata, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 421 days.

(21) Appl. No.: 18/354,078

(22) Filed: Jul. 18, 2023

(65) Prior Publication Data

US 2024/0045347 A1 Feb. 8, 2024

(30) Foreign Application Priority Data

Aug. 8, 2022 (JP) ................................ 2022-126391

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC ............................ G03F 9/7042; G03F 7/0002
See application file for complete search history.

(56) References Cited

U.S. PATENT DOCUMENTS 7,828,984 B2 11/2010 Seki et al.
2022/0063177 A1 3/2022 Sato

FOREIGN PATENT DOCUMENTS

JP 4533358 B2 9/2010
KR 1020160121433 A 10/2016
KR 1020190117386 A 10/2019
KR 20210093783 A * 7/2021 ........... G03F 9/7042
KR 1020210093783 A 7/2021
KR 1020210117193 A 9/2021
KR 1020210134514 A 11/2021
KR 20220027034 A * 3/2022 ........... G03F 9/7088
KR 1020220027034 A 3/2022

OTHER PUBLICATIONS

Translation of Sato 783 KR-20210093783-A (Year: 2021).*
Translation of Sato 034 KR-20220027034-A (Year: 2022).*
Office Action issued in Korean Appln. No. 10-2023-0099459 mailed on Aug. 20, 2025.

* cited by examiner

*Primary Examiner* — JaMel M Nelson
*Assistant Examiner* — Erica Hartsell Funk
(74) *Attorney, Agent, or Firm* — ROSSI, KIMMS & McDOWELL LLP

(57) ABSTRACT

The throughput is improved by changing a timing of beginning aligning between a mold and a substrate depending on an area in a pattern-forming region where a pattern can be formed. An imprinting method for forming a pattern of an imprint material in a plurality of pattern-forming regions on a substrate using a mold having a pattern portion, having contacting the mold and the imprint material and relatively aligning the mold and the pattern-forming region based on a positional relationship between the mold and an alignment mark of each pattern-forming region, in which, in the aligning, a timing of beginning the aligning is earlier relative to the contacting if an area in the plurality of pattern-forming regions where a pattern can be formed is a second area that is wider than a first area than if an area is the first area.

8 Claims, 6 Drawing Sheets

100
CONTROL UNIT
40
20
13
15
2
12
1
IM
103
19
S2
S1
PP
110
111
31
30
11
17
10
16
14
X
Y
Z

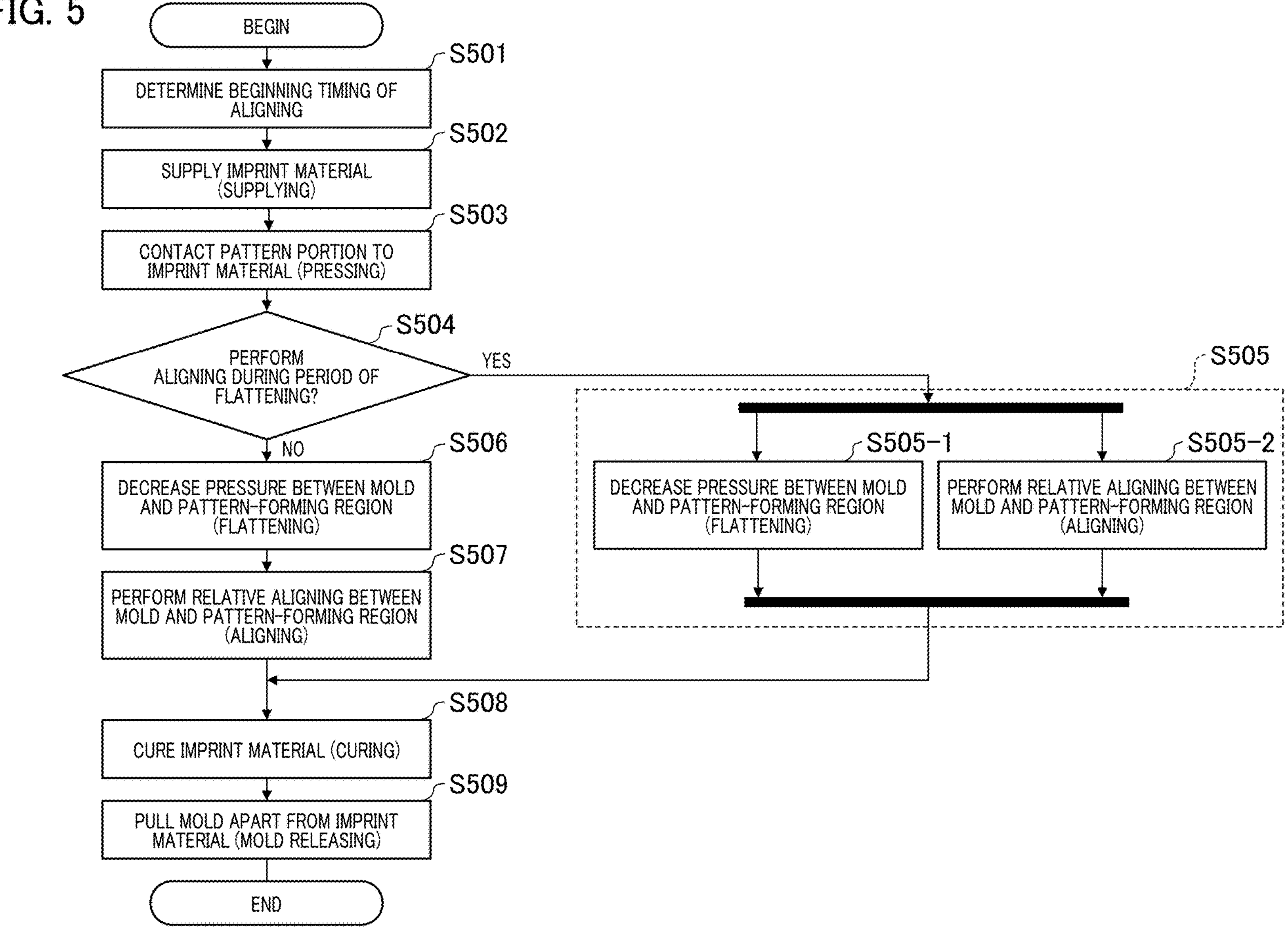
FIG. 5
BEGIN
S501
DETERMINE BEGINNING TIMING OF ALIGNING
S502
SUPPLY IMPRINT MATERIAL (SUPPLYING)
S503
CONTACT PATTERN PORTION TO IMPRINT MATERIAL (PRESSING)
S504
PERFORM ALIGNING DURING PERIOD OF FLATTENING?
YES
NO
S505
S505-1
DECREASE PRESSURE BETWEEN MOLD AND PATTERN-FORMING REGION (FLATTENING)
S505-2
PERFORM RELATIVE ALIGNING BETWEEN MOLD AND PATTERN-FORMING REGION (ALIGNING)
S506
DECREASE PRESSURE BETWEEN MOLD AND PATTERN-FORMING REGION (FLATTENING)
S507
PERFORM RELATIVE ALIGNING BETWEEN MOLD AND PATTERN-FORMING REGION (ALIGNING)
S508
CURE IMPRINT MATERIAL (CURING)
S509
PULL MOLD APART FROM IMPRINT MATERIAL (MOLD RELEASING)
END

IMPRINTING METHOD, IMPRINT APPARATUS AND ARTICLE MANUFACTURING METHOD

BACKGROUND OF THE INVENTION

Field of the Invention

The present invention relates to an imprinting method, an imprint apparatus and an article manufacturing method.

Description of the Related Art

As a lithography apparatus for manufacturing semiconductor devices, MEMS or the like, an imprint apparatus for molding an imprint material on a substrate using a mold is known. In the imprint apparatus, a liquid-form imprint material is supplied onto the substrate, the mold and the imprint material on the substrate are contacted with each other, the imprint material is then cured in that state, and the mold is detached from the cured imprint material. This makes it possible to form a pattern of the imprint material on the substrate.

In an imprinting treatment, before the imprint material is cured, the mold and the substrate are aligned in a state where the mold and the imprint material on the substrate have been contacted with each other. In order to rapidly finish the aligning of the mold and the substrate in the imprinting treatment, it is effective to shorten a time from a stage where aligning of the mold and the substrate is possible to the beginning of the aligning.

In Japanese Patent No. 4533358, a method in which a time taken for an aligning treatment is shortened by decreasing a pressure that is applied to an imprint material compared with a pressure that is applied to the imprint material at the time of enlarging the contact area between a mold and the imprint material in the aligning of the mold and the substrate has been proposed.

In the imprinting treatment, if air bubbles remain between the mold and the substrate when the mold and the imprint material on the substrate have been contacted with each other, defects are generated in a pattern of the imprint material formed on the substrate. Therefore, when the central region of the pattern portion of the mold is contacted with the imprint material, the central region begins to be contacted with a position close to the central region in the effective area of a pattern-forming region of the substrate or a proximate portion thereof so that the mold and/or the substrate deform and the remaining of air bubbles is reduced.

A plurality of pattern-forming regions on the substrate may include rectangular regions called full fields and non-rectangular regions called partial fields. The full field is a region having a contour that is not limited by the edge of the substrate and is a region where all of the area of the pattern portion having an uneven shape formed on the mold can be formed. The partial field is a region having a contour that is limited by the edge of the substrate and is a region where a part of the area of the pattern portion having an uneven shape formed on the mold can be formed. A part of the partial field may have a shape along the edge of the substrate. That is, the region of the partial field is a region including the outer circumference of the substrate.

Here, the partial field is a region including the outer circumference of the substrate and is thus characterized in that, compared with the full field, a shape that deforms the mold or the substrate, at least the mold, may become complicated and the contact posture may become unstable. In addition, this unstable state causes a variation in the relative positions between the mold and the substrate in some cases, and a timing at which the relative positions between the mold and the substrate become stable after the contact between the imprint material on the substrate and the pattern portion begins differs between the partial field and the full field. In addition, when aligning of the mold and the substrate is not performed in a state where the relative positions have become stable or are stable, a phenomenon in which favorable aligning is not possible or the like occurs, and thus the aligning needs to be performed in a state where the relative positions have become stable or are stable.

At the time of contacting the pattern portion of the mold with the imprint material, a pressure is applied to a predetermined surface of the mold. In addition, the pattern portion of the mold is contacted with the imprint material in a state where the pressure is applied to the mold, and then the pressure is gradually decreased (decompressing treatment). When this decompressing treatment is completed, since the relative positions between the mold and the substrate become stable, conventionally, aligning of the mold and the substrate has been performed after this decompressing treatment is completed in both the partial fields and the full fields.

SUMMARY OF THE INVENTION

Therefore, an objective of the present invention is to provide an imprinting method in which the throughput is improved by changing the timing of beginning aligning between a mold and a substrate depending on an area in a pattern-forming region where a pattern can be formed.

An imprinting method as an aspect of the present invention is an imprinting method for forming a pattern of an imprint material in a plurality of pattern-forming regions on a substrate using a mold having a pattern portion, having contacting the mold and the imprint material and relatively aligning the mold and the pattern-forming regions based on a positional relationship between the mold and an alignment mark of each pattern-forming region, in which, in the aligning, a timing of beginning the aligning is earlier relative to the contacting if an area in the plurality of pattern-forming regions where a pattern can be formed is a second area that is wider than a first area than if the area is the first area.

Further features of the present invention will become apparent from the following description of exemplary embodiments (with reference to the attached drawings).

BRIEF DESCRIPTION OF THE DRAWINGS

FIG. 5 is a view showing an exemplary operation flow of an imprint apparatus according to First Embodiment.

DESCRIPTION OF THE EMBODIMENTS

Hereinafter, a preferable embodiment of the present invention will be described using examples and drawings with reference to the accompanying drawings. In each drawing, the same member or element will be given the same reference sign, and duplicate description is omitted or simplified.

In the examples to be described below, a Z axis is defined to be parallel to the optical axis of a lighting system that radiates irradiation light to an imprint material IM on a substrate 2, and an X axis and an Y axis are defined to be orthogonal to each other in a plane perpendicular to the Z axis. In addition, directions that are parallel to the X axis, the Y axis and the Z axis in the XYZ coordinate system, respectively, are defined as an X direction, an Y direction and a Z direction, and rotation around the X axis, rotation around the Y axis and rotation around the Z axis are defined as θX, θY and θZ, respectively. Controls or drives relating to the X axis, the Y axis and the Z axis mean controls or drives relating to the direction parallel to the X axis, the direction parallel to the Y axis and the direction parallel to the Z axis, respectively.

In addition, controls or drives relating to the θX axis, the θY axis and the θZ axis mean controls or drives relating to rotation around an axis parallel to the X axis, rotation around an axis parallel to the Y axis and rotation around an axis parallel to the Z axis, respectively. In addition, positions are information that can be specified based on the coordinates of the X axis, the Y axis and the Z axis, and postures are information that can be specified with the values of the θX axis, the θY axis and the θZ axis. Position determination means the controls of positions and/or postures. Aligning may include the controls of the position and/or posture of at least one of the substrate 2 and a mold 1.

First Embodiment

Figure 1:
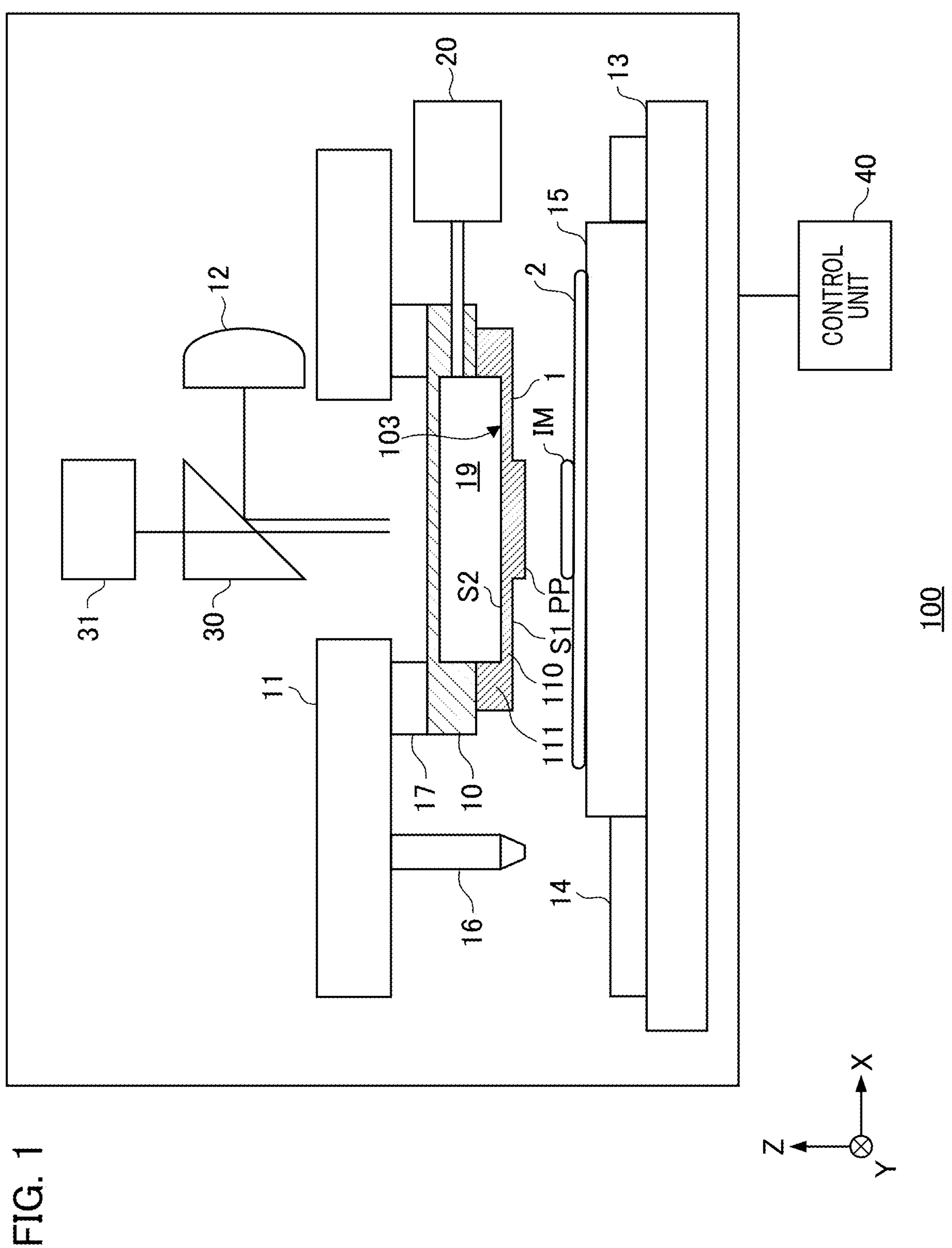
FIG. 1 is a view schematically showing the configuration of an imprint apparatus according to First Embodiment.

FIG. 1 is a view schematically showing the configuration of an imprint apparatus 100 according to Present Embodiment. The imprint apparatus 100 is an apparatus configured to form a pattern composed of a cured product of the imprint material IM disposed on the substrate 2 on the substrate 2 by contacting the imprint material IM and a pattern portion PP of the mold 1 and curing the imprint material IM. The imprint apparatus 100 is used to manufacture, for example, devices such as semiconductor devices. Here, a photocuring method is adopted in the imprint apparatus.

As the imprint material IM, a curable composition that cures when imparted with energy for curing (also referred to as a resin in a non-cured state in some cases) is used. As the energy for curing, electromagnetic waves, heat or the like can be used. The electromagnetic waves can be, for example, light having a wavelength selected from a range of 10 nm or longer and 1 mm or shorter, for example, infrared rays, visible rays or ultraviolet rays. The curable composition can be a composition that cures by irradiation with light or heating.

Particularly, a photocurable composition that cures by irradiation with light contains at least a polymerizable compound and a photopolymerization initiator and may further contain a non-polymerizable compound or a solvent as necessary. The non-polymerizable compound is at least one selected from the group consisting of a sensitizer, a hydrogen donor, an internal release agent, a surfactant, an antioxidant, a polymer component and the like. The imprint material can be disposed on the substrate in a liquid droplet shape, an island shape in which a plurality of liquid droplets is connected together or a film form. The viscosity (viscosity at 25° C.) of the imprint material can be, for example, 1 mPa·s or higher and 100 mPa·s or lower. As a material of the substrate 2, for example, glass, a ceramic, a metal, a semiconductor, a resin or the like can be used. A member composed of a material different from the substrate may be provided on the surface of the substrate 2 as necessary.

The mold 1 is configured to include a diaphragm 110 and a support portion 111 configured to support the diaphragm 110. The mold 1 has a rectangular outer circumferential shape and has the pattern portion (mesa portion) PP provided with a three-dimensionally formed pattern (an uneven pattern that needs to be transferred to the substrate 2 such as a circuit pattern) on a surface facing the substrate 2 (pattern surface). The mold 1 is composed of a material capable of transmitting light, for example, quartz.

The diaphragm 110 has a first surface Si having the pattern portion PP and a second surface S2 on the side opposite to the first surface S1. The mold 1 has a cavity 103 (hollow space) opened on the second surface S2 side. However, the configuration is not limited thereto, and the mold 1 may be configured not to have the cavity 103. The support portion 111 is held with a mold holding portion 10 to be described below.

The substrate 2 is, for example, a single-crystal silicon substrate or a silicon on insulator (SOI) substrate, and the imprint material IM, a pattern of which is to be formed with the pattern portion PP formed on the mold 1, is applied to this to-be-treated surface. In addition, the substrate 2 may be any of a variety of substrates such as a gallium arsenic wafer, a composite bonded wafer, a glass wafer containing quartz, a liquid crystal panel substrate and a reticle. In addition, the outer shape may be not only a circular shape but also a square shape or the like.

The imprint apparatus 100 in Present Embodiment includes the mold holding portion 10, a structure 11, an irradiation portion 12, a base surface plate 13, a substrate driving mechanism 14, a substrate holding portion 15, a dispenser 16, a mold driving mechanism 17, a pressure control mechanism 20, an image capturing portion 31 and a control unit 40.

The mold holding portion 10 has the mold driving mechanism (moving unit) 17 configured to move the mold 1 while holding the mold 1. The mold holding portion 10 holds the mold 1 through the support portion 111 so that a space 19 is formed on the second surface S2 side of the diaphragm 110. The mold holding portion 10 is capable of holding the mold 1 by attracting the outer circumferential region of a surface irradiated with irradiation light in the mold 1 by a vacuum adsorption force or an electrostatic force. The structure 11 supports the mold driving mechanism 17.

The irradiation portion (curing portion) 12 cures the imprint material IM by irradiating the imprint material IM on the substrate 2 with irradiation light, for example, ultraviolet rays or the like, through a prism 30. The irradiation portion 12 may include an exposure light source, which is not shown, an optical element configured to adjust irradiation light radiated from this exposure light source to appropriate light for imprinting and a shading plate (masking plate) configured to limit a region irradiated (range irradiated) with the irradiation light radiated from the exposure light source.

The substrate holding portion 15 has the substrate driving mechanism (moving portion) 14 enabling the substrate 2 to move in each axial direction while holding the substrate 2. The base surface plate 13 supports the substrate holding portion 15 and the substrate driving mechanism 14.

The substrate driving mechanism 14 and the mold driving mechanism 17 are configured as a relative driving mechanism configured to drive at least one of the substrate 2 and the mold 1 so that the relative positions between the substrate 2 and the mold 1 are adjusted. The adjustment of the relative positions with the relative driving mechanism (the substrate driving mechanism 14 and the mold driving mechanism 17) includes contacting between the imprint material IM on the substrate 2 and the pattern portion PP of the mold 1 and driving for separation of the cured imprint material IM and the mold 1.

The substrate driving mechanism 14 can be configured so as to drive the substrate 2 in a plurality of axes (for example, three axes of the X axis, the Y axis and the θZ axis, preferably, six axes of the X axis, Y axis, the Z axis, the θX axis, the θY axis and the θZ axis). The mold driving mechanism 17 can be configured so as to drive the mold 1 in a plurality of axes (for example, three axes of the Z axis, the θX axis and the θY axis, preferably, six axes of the X axis, Y axis, the Z axis, the θX axis, the θY axis and the θZ axis).

The dispenser (supply portion) 16 disposes (supplies) the imprint material IM on pattern-forming regions (imprint regions) on the substrate 2. The dispenser 16 is capable of disposing the imprint material IM on a target position on the substrate 2 by ejecting the imprint material IM from the dispenser 16 while scanning the substrate 2 with the substrate driving mechanism 14.

The pressure control mechanism 20 is capable of curving the diaphragm 110 by controlling a pressure against the second surface S2 (that is, the pressure in the space 19) so that the diaphragm 110 of the mold 1 forms a protruding shape toward the substrate 2. The curved diaphragm 110 returns to a flat state by decreasing the pressure against the second surface S2 (decompressing). The pressure against the second surface S2 (the pressure in the space 19) is also referred to as the cavity pressure.

The image capturing portion 31 is composed of one or a plurality of portions and measures the relative positions between an alignment mark in a pattern-forming region of the substrate 2 and an alignment mark in the mold 1 by capturing an image that is formed of both alignment marks. The image capturing portion 31 can be configured to perform the above-described image capturing through the prism 30.

The control unit 40 includes a CPU, a memory (storage portion) and the like, is composed of at least one computer and is connected to each configuration element of the imprint apparatus 100 through a line. In addition, the control unit 40 statistically controls the operation adjustment or the like of each configuration element of the entire imprint apparatus 100 according to a program stored in the memory. That is, the control unit 40 controls the irradiation portion 12, the substrate driving mechanism 14, the dispenser 16, the mold driving mechanism 17, the pressure control mechanism 20, the image capturing portion 31 and the like. The control unit 40 may be configured integrally (within a common chassis) with other portions of the imprint apparatus 100. Furthermore, the control unit may be configured as a separate body (within a separate chassis) from other portions of the imprint apparatus 100 or may be installed at a separate place from the imprint apparatus 100 and controlled remotely.

In addition, the control unit 40 may be composed of, for example, a programmable logic device (PLD) such as a field programmable gate array (FPGA) or the like. Alternatively, the control unit may be composed of an application specific integrated circuit (ASIC). Alternatively, the control unit may be composed of a general-purpose computer into which a program has been incorporated or may be composed of a combination of all or parts thereof.

An imprinting treatment that is a treatment for forming a pattern with the imprint material IM on the pattern-forming regions of the substrate 2, which is performed with the imprint apparatus 100 of Present Embodiment, may include supplying, contacting, aligning, curing and mold releasing. This imprinting treatment is performed on one pattern-forming region in the order of the supplying, the contacting, the aligning, the curing and the mold releasing.

The supplying (applying and disposing) is supplying (applying and disposing) the imprint material IM to the pattern-forming regions of the substrate 2 with the dispenser 16. In the contacting, the imprint material IM on the pattern-forming regions of the substrate 2 and the pattern portion PP of the mold 1 are contacted with each other, and then the contact region between the imprint material IM and the pattern portion PP is enlarged up to all of the pattern-forming regions. This makes the pattern portion PP of the mold 1 filled with the imprint material TM. In the aligning, while the relative positions between the alignment mark of a pattern-forming region of the substrate 2 and the alignment mark of the mold 1 are detected based on an image captured with the image capturing portion 31, the pattern-forming region and the pattern portion PP are aligned together based on a detection result. This aligning is performed by controlling the relative driving mechanism with the control unit 40. In the curing, the imprint material IM on the substrate 2 is irradiated with the irradiation light (energy for curing) radiated from the irradiation portion 12, and the imprint material IM is cured. This makes a pattern composed of a cured product of the imprint material IM formed in the pattern-forming regions of the substrate 2. In the mold releasing, the cured imprint material IM and the mold 1 are pulled apart with a relative driving mechanism 25.

As described above, the imprint apparatus 100 of Present Embodiment performs the imprinting treatment on each pattern-forming region in the order of the supplying, the contacting, the aligning, the curing and the mold releasing and forms a pattern with the imprint material IM on the pattern-forming regions of the substrate 2. The imprint material IM may be disposed on the entire substrate 2 in advance before the imprinting treatment begins, and, in this case, the contacting, the aligning, the curing and the mold releasing, excluding the supplying, may be performed as the imprinting treatment.

Figure 2A:
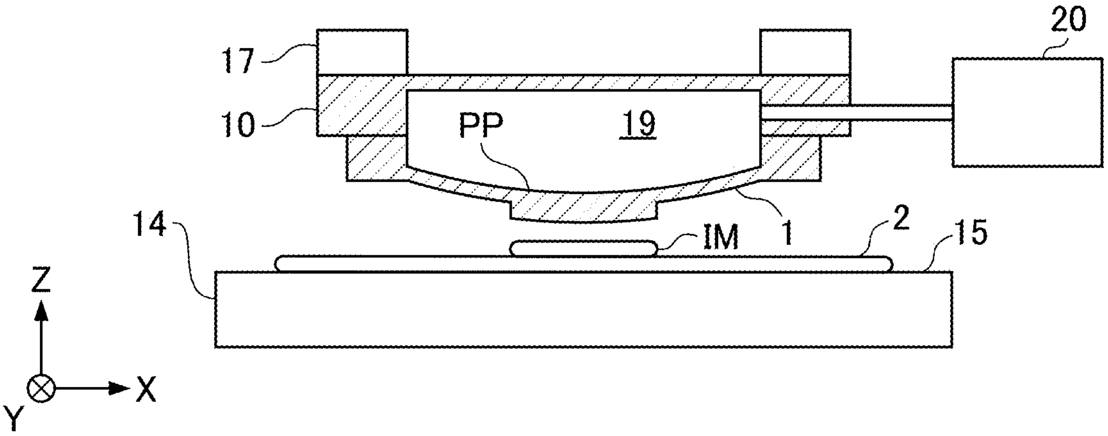
FIG. 2A to FIG. 2C are views schematically showing contacting an imprint material on pattern-forming regions of a substrate of First Embodiment and a pattern portion of a mold.
Figure 2B:
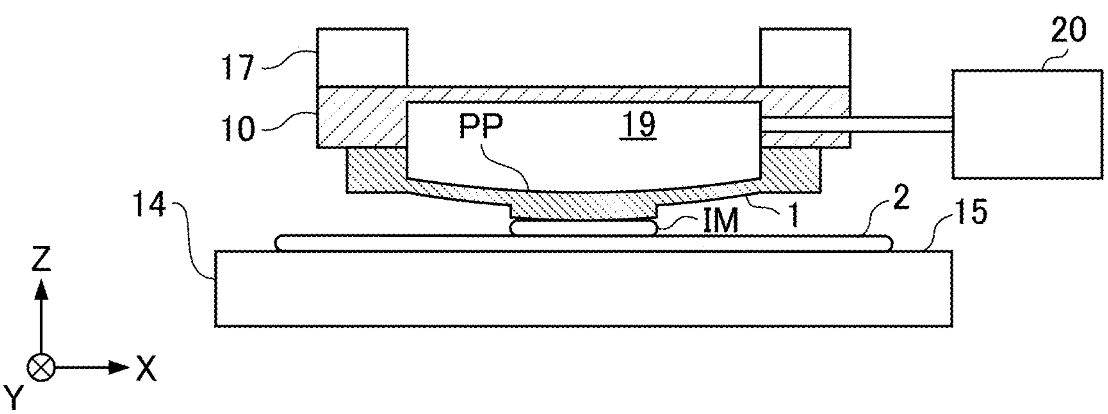
Figure 2C:
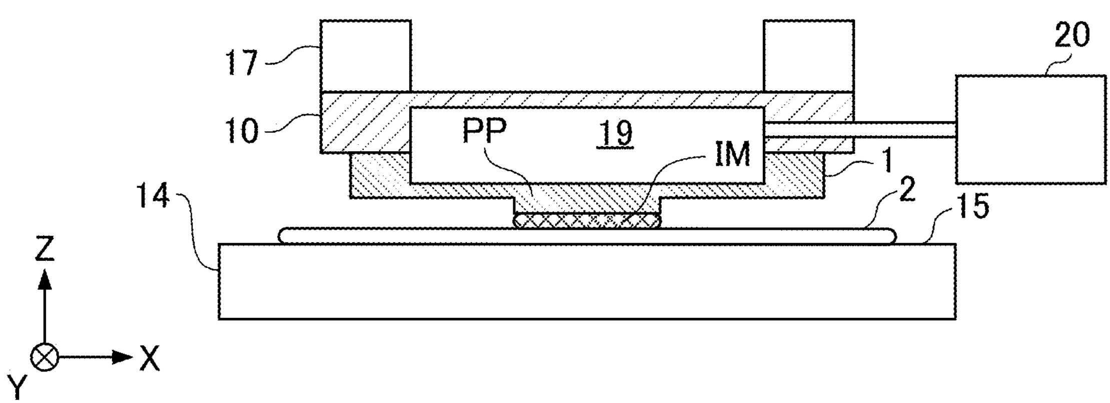

FIG. 2 is a view schematically showing the contacting that contacts the imprint material IM on the pattern-forming regions of the substrate 2 and the pattern portion PP of the mold 1. FIG. 2A is a view of a state where a pressure is applied to the second surface S2 so that the diaphragm 110 of the mold 1 forms a protruding shape toward the substrate 2. FIG. 2B is a view of a state where the pattern portion PP is contacted with the imprint material IM while the state of FIG. 2A is continued. FIG. 2C is a view of a state where the pressure has been decreased so that the pattern portion PP is in a flat state.

The contacting in Present Embodiment includes pressing and flattening (decompressing). The pressing is contacting the pattern portion PP and the imprint material IM on the pattern-forming regions and applying a pressure between the mold 1 and the pattern-forming regions to widen the contact area between the mold 1 and the imprint material IM. In addition, when FIG. 2 is referred to, the pressing is from the state of FIG. 2A to the state of FIG. 2B.

The flattening (decompressing) is decreasing the pressure (cavity pressure) that is acting on the second surface S2 so that the diaphragm 110 of the mold 1 forms a protruding shape toward the substrate 2. The flattening makes it possible to decrease the pressure between the mold 1 and the pattern-forming regions and makes it possible to put the pattern portion PP of the mold 1 into a flat state. In addition, when FIG. 2 is referred to, the flattening is from the state of FIG. 2B to the state of FIG. 2C.

The flow of the pressing and the flattening will be described with reference to FIG. 2. First, in the pressing, as shown in FIG. 2A, the control unit 40 controls the pressure control mechanism 20, whereby the pressure against the second surface S2 of the mold 1 is controlled so that the diaphragm 110 of the mold 1 forms a protruding shape toward the substrate 2. In addition, the relative pressing of the pattern portion PP against the imprint material IM on the pattern-forming regions of the substrate 2 is begun in a state where the diaphragm 110 has curved (deformed), whereby the state of FIG. 2B is reached.

Next, as shown in FIG. 2B, the control unit 40 controls the relative driving mechanism, whereby the distance between the substrate 2 and the mold 1 and a force that presses the mold 1 against the imprint material IM on the substrate 2 are controlled. In addition, the relative pressing of the pattern portion PP of the mold 1 against the imprint material IM on the pattern-forming regions of the substrate 2 enlarges the contact region between the imprint material IM and the pattern portion PP.

Next, in the flattening, the control unit 40 controls the pressure control mechanism 20, whereby the cavity pressure is decreased and converged to a first predetermined value. Additionally, the control unit 40 controls the relative driving mechanism, whereby the pressing force of the pattern portion PP against the imprint material IM is decreased and converged to a second predetermined value. This forms the state of FIG. 2C. At this time, the pattern portion PP (diaphragm 110) of the mold 1 is in a flat state. The first predetermined value and the second predetermined value preferably become zero, but may be a value close to zero instead of zero. As described above, the flattening is performed after the pressing.

Figure 3:
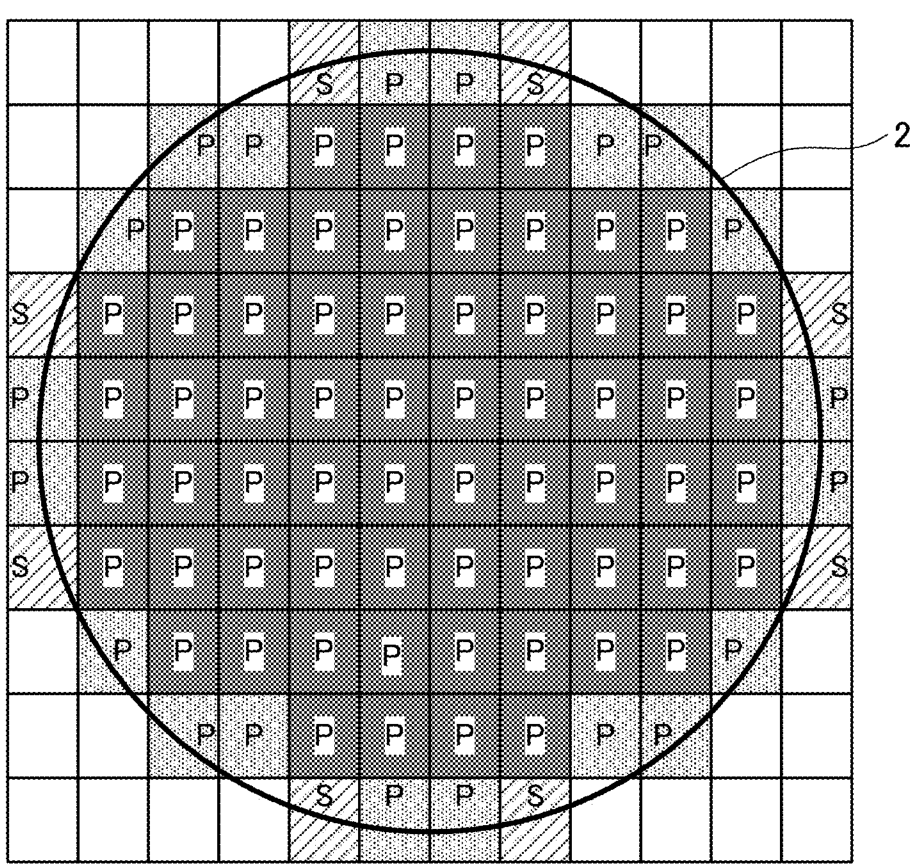
FIG. 3 is a view showing exemplary allocation of the pattern-forming regions of the substrate of First Embodiment and a beginning timing of aligning.

FIG. 3 is a view exemplarily showing the allocation (layout) of the pattern-forming regions of the substrate 2. Individual pattern-forming regions on the substrate 2 in Present Embodiment are classified into a plurality of types depending on the area where a pattern can be formed.

Here, a pattern-forming region where all of the area of the pattern portion PP formed in the mold 1 can be formed is defined as a first classification. Furthermore, a pattern-forming region where 50% or more and less than 100% of the area of the pattern portion PP formed in the mold 1 can be formed is defined as a second classification. Furthermore, a pattern-forming region where less than 50% of the area of the pattern portion PP formed in the mold 1 can be formed is defined as a third classification. As described above, the pattern-forming regions in Present Embodiment are divided into three classifications.

The pattern-forming region of the first classification in Present Embodiment is a rectangular region that is called a full field (FF). The full field is preferably a region where all of the area of the pattern portion PP can be formed, but may be a region where not all of the area of the pattern portion PP but a proportion of a predetermined value or more of the area of the pattern portion PP can be formed.

The pattern-forming regions of the second classification and the third classification are non-rectangular regions that are called partial fields (PF). The partial field is a region where a part (a predetermined value or less) of the area of the pattern portion PP can be formed. In addition, as exemplified in FIG. 3, the full fields, which are the pattern-forming regions of the first classification, are regions not including the outer circumference of the substrate 2, and the partial fields, which are the pattern-forming regions of the second classification and the third classification, are regions including the outer circumference of the substrate 2.

A case where the mold 1 and the substrate 2 have been pressed in a parallel state in the pressing is assumed. In this case, in the pattern-forming region of the first classification, the contact of the pattern portion PP with the imprint material IM is begun in a state where the endmost portion of the pattern portion PP of the mold 1 forming a protruding shape in the Z direction and the central region (geometrical central portion) in an effective area of the pattern-forming region of the substrate 2 substantially coincide with each other. The effective area is the area of the pattern portion PP of the mold 1 where a pattern can be formed.

Furthermore, in the pattern-forming region of the second classification, the contact of the pattern portion PP with the imprint material IM is begun in a state where the endmost portion of the pattern portion PP of the mold 1 forming a protruding shape deviates from the central region in the effective area of the pattern-forming region of the substrate 2. Furthermore, in the pattern-forming region of the third classification, the contact of the pattern portion PP with the imprint material IM is begun in a state where the endmost portion of the pattern portion PP of the mold 1 forming a protruding shape is outside the pattern-forming region of the substrate 2 or is on the pattern-forming region but at a position close to the outer circumference of the substrate 2.

Figure 4:
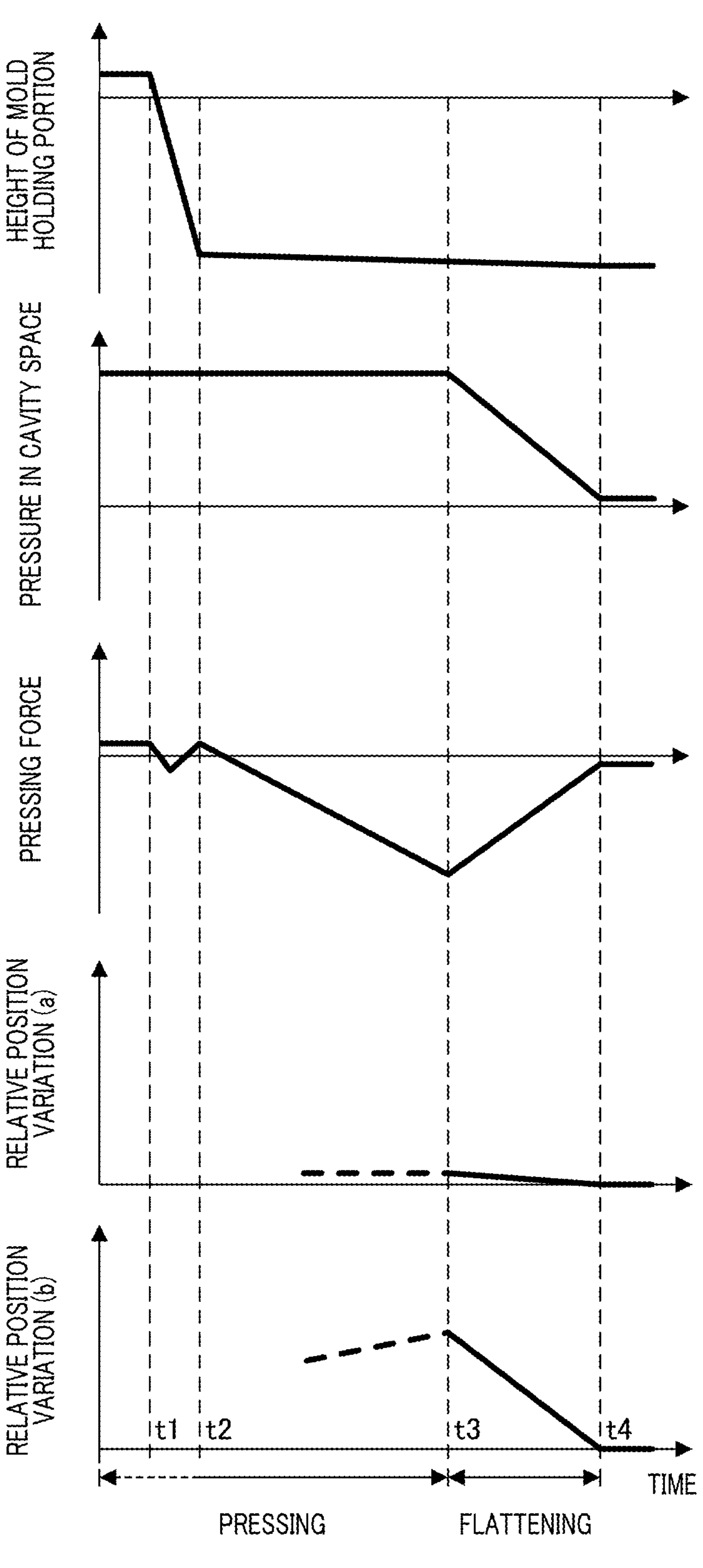
FIG. 4 is a view exemplifying the height of a mold holding portion, the pressure in a cavity space, a pressing force and relative position variations of the mold and the substrate in the contacting of First Embodiment.

FIG. 4 is a view exemplifying the height of the mold holding portion 10, the pressure in the cavity space, the pressing force and temporal changes of the relative position variation between the pattern portion PP of the mold 1 and the substrate 2 in the contacting. In FIG. 4, the temporal changes are indicated along the horizontal axis, and t1, t2, t3 and t4 exemplify the timings of the operations and treatments of the imprint apparatus 100 over the temporal changes.

The height of the mold holding portion 10 and the pressing force are controlled by controlling the driving of the mold driving mechanism 17 with the control unit 40. The height of the mold holding portion 10 is indicated with the standard position in the Z axis direction set to zero. The height of the support portion 111 of the mold 1 has a certain offset value with respect to the height of the mold holding portion 10. The pressing force is a force that is generated in an actuator (not shown) in the mold driving mechanism 17. As described above, the cavity pressure is controlled by controlling the pressure control mechanism 20 with the control unit 40.

First, the pressure in the cavity space is made into a positive pressure so that the diaphragm 110 of the mold 1 forms a protruding shape toward the substrate 2. Next, at the timing t1, the mold holding portion 10 begins to move (lower) toward the surface of the substrate 2 from the standard position (waiting position). At the timing t2, the moving speed (lowering speed) of the mold holding portion 10 is made to be a slower speed than the speed from the timing t1 to the timing t2, and the pattern portion PP of the mold 1 is contacted with the imprint material IM on the substrate 2. After that, the contact region between the imprint material MI and the pattern portion PP is gradually enlarged, and the pattern portion PP is filled with the imprint material IM. From the beginning of the timing t2 to near the timing t3, the pressing force (absolute value) gradually increases due to the contact between the imprint material IM and the pattern portion PP. At near the timing t4, the cavity pressure converges to the first predetermined value, and the pressing force converges to the second predetermined value.

In the example of FIG. 4, a period from the timing t2 to the timing t3 is the pressing, and a period from the timing t3 to the timing t4 is the flattening. Therefore, a period from the timing t1 to the timing t4 is the contacting. Here, for example, a step up to the beginning of the timing t2 is defined as a separate step. In addition, at the timing t3, a time during which the state is maintained may be provided. The time during which the state at the timing t3 is maintained is included in the flattening, and the time is set in advance.

Here, for example, a case where the pattern portion PP of the curved mold 1 is contacted with the imprint material IM in the pressing of the pattern-forming region of the third classification is assumed. In this case, as described above, the contact is begun in a state where the endmost portion of the pattern portion PP of the mold 1 is outside the pattern-forming region of the substrate 2 or is on the pattern-forming region but at a position close to the outer circumference of the substrate 2. Therefore, a shape that deforms at least any of the mold 1 or the substrate 2 becomes complicated, and the contact posture may become unstable. This unstable state may cause a variation in the relative positions between the mold 1 and the substrate 2.

In the relative position variation (a) shown in FIG. 4, a variation in the relative positions between the pattern portion PP of the mold 1 and the pattern-forming region of the substrate 2 in the contacting of the pattern-forming region of the first classification is exemplified. The relative positions when the pattern portion PP of the mold 1 has been made to be flat after the flattening is shown as the standard position. During the period of the pressing, the contact between the imprint material IM and an alignment mark that can be disposed in the peripheral portion of the pattern-forming region is completed at the end of the period.

Before a state where the imprint material IM has been contacted with the alignment mark to a certain extent (a state where the pattern portion PP has been filled with a predetermined amount or more of the imprint material IM), appropriate detection of the relative positions between the pattern portion PP of the mold 1 and the pattern-forming region of the substrate 2 is not possible.

Therefore, the detection of the relative position of the pattern-forming region of the first classification becomes possible in the flattening, which is the period from the timing t3 to the timing t4. During the period of the flattening during which the pattern portion PP of the mold 1 is returned to be flat, if a pattern is formed in the first classification, the mold 1 and the substrate 2 are pressed in a parallel state, and the contact is maintained in a stable posture, whereby a variation in the relative positions is small.

In the pattern-forming region of the second classification, if the mold 1 and the substrate 2 are pressed in a parallel state in the same manner as in the first classification depending on the effective area of the pattern-forming region, deviation or the like, the variation in the relative positions can be the same degree as that in the pattern-forming region of the first classification. In addition, even if the degree is not the same, the variation becomes smaller than the variation in the relative positions in the pattern-forming region of the third classification to be described below. In addition, in the pattern-forming region of the second classification, if the contact is begun in a state where the endmost portion of the pattern portion PP of the mold 1 forming a protruding shape has deviated from the central region in the effective area of the pattern-forming region of the substrate 2 by a predetermined threshold value or more, the contact posture becomes unstable. In this case, the variation becomes larger than the variation in the relative positions in the pattern-forming region of the first classification. As described above, the pattern-forming region of the second classification is a region where the variation in the relative positions can be small or large depending on the effective area of the pattern-forming region, deviation or the like. The threshold value in this case is set in advance before the imprinting treatment is begun.

In the relative position variation (b) of FIG. 4, a variation in the relative positions between the pattern portion PP of the mold 1 and the pattern-forming region of the substrate 2 in the contacting of the pattern-forming region of the third classification is exemplified. In the pressing of the pattern-forming region of the third classification, the contact is begun in a state where the endmost portion of the pattern portion PP of the mold 1 is outside the pattern-forming region of the substrate 2 or is on the pattern-forming region but at a position close to the outer circumference of the substrate 2. Therefore, a shape that deforms the mold 1 or the substrate 2 becomes complicated, and the contact posture may become unstable.

During the period of the flattening, if a pattern is formed in the pattern-forming region of the third classification, the contact state between the pattern portion PP of the mold 1 and the pattern-forming region of the substrate 2 becomes unstable. Therefore, the variation in the relative positions in the process of the pattern portion PP of the mold 1 being returned to be flat is large compared with the variation in the pattern-forming region of the first classification or the second classification. The variation in the relative positions between the pattern portion PP of the mold 1 and the pattern-forming region of the substrate 2 acts as one of the causes for impairing the control of the relative positions in the aligning.

The aligning preferably begins in a state where the variation in the relative positions is small and has become stable within a permissible range. That is, in the pattern-forming region where the variation in the relative positions is small from the flattening as exemplified in the relative position variation (a) of FIG. 4, it is possible to begin the aligning during the period of the flattening. At this time, in the aligning, aligning is performed while the pressure in the cavity is decreased.

An imprinting method in the imprint apparatus 100 of Present Embodiment will be described with reference to FIG. 3 and FIG. 5. FIG. 5 is a flowchart showing an example of treatments in the imprint apparatus 100 according to Present Embodiment (the flow of the imprinting treatment for forming a pattern with the imprint material IM on the pattern-forming regions of the substrate 2). Each operation (treatment) shown in the flowchart of FIG. 5 is controlled with the control unit 40 executing a computer program. In addition, in the following description, each step will be denoted with "S" in the head, and the expression of "step" is omitted.

First, in S501, the control unit 40 determines a beginning timing of the aligning in a pattern-forming region that is a pattern formation target. The beginning timing of the aligning is determined for each pattern-forming region based on a classification identified by the control unit 40 or the like. That is, in S501, timings of beginning the aligning relative to the contacting are determined depending on the areas in a plurality of pattern-forming regions where a pattern can be formed. This makes it possible to change the beginning timing of the aligning depending on the area where a pattern can be formed. Specifically, regarding the beginning timings of the aligning, whether the aligning is begun after the flattening or begun during the period of the flattening is determined depending on the areas in the plurality of pattern-forming regions where a pattern can be formed.

Here, upon identifying a pattern-forming region, if the area of the pattern-forming region where a pattern is to be formed is all of the area of the pattern portion PP of the mold 1 as described above, the control unit 40 identifies the pattern-forming region as the pattern-forming region of the first classification. If the area where a pattern is to be formed is 50% or more and less than 100% of the area of the pattern portion PP of the mold 1, the pattern-forming region is identified as the pattern-forming region of the second classification. If the area where a pattern is to be formed is less than 50% of the area of the pattern portion PP of the mold 1, the pattern-forming region is identified as the pattern-forming region of the third classification. In the present treatment, the beginning timing of the aligning is set for each pattern-forming region based on the area of the pattern-forming region where a pattern is to be formed. Upon identifying the pattern-forming region of the first classification, a region where not all of the area of the pattern portion PP but a proportion of a predetermined value or more of the area of the pattern portion PP can be formed may be identified as the first classification.

Here, regarding the beginning timing of the aligning, if a pattern-forming region is identified as the first classification, the aligning is set to be begun in parallel with the flattening during the period of the flattening (decompressing) in the contacting. If a pattern-forming region is identified as the third classification, the aligning is set to be performed after the completion of the flattening (decompressing). If a pattern-forming region is identified as the second classification, the beginning timing is set with further reference to the pressing.

In the setting of the pressing, if the mold 1 and the substrate 2 are set to be pressed in a parallel state as in the pattern-forming region identified as the first identification, the pressing is set to be begun in parallel with the flattening during the period of the flattening in the contacting. When the endmost portion of the pattern portion PP has been contacted with the imprint material IM, if the deviation from the central region in the effective area of the pattern-forming region is less than the predetermined threshold value, the pressing may be set to be begun in parallel with the flattening during the period of the flattening in the contacting. Specifically, if the endmost portion of the pattern portion PP of the mold 1 forming a protruding shape does not deviate from the central region in the effective area of the pattern-forming region of the substrate 2 in at least any direction of the X direction or the Y direction by a predetermined amount or more, the aligning is begun during the period of the flattening.

On the other hand, when the endmost portion of the pattern portion PP has been contacted with the imprint material IM, if the contact is set to be begun with the deviation from the central region in the effective area of the pattern-forming region being the predetermined threshold value or more, the contact is set to be begun after the contacting (flattening). Specifically, if the endmost portion of the pattern portion PP of the mold 1 forming a protruding shape deviates from the central region in the effective area of the pattern-forming region of the substrate 2 in at least any direction of the X direction or the Y direction by a predetermined amount or more, the aligning is begun after the completion of the flattening.

Regarding the setting of the beginning timing of the aligning, the beginning timing may be set in advance together with the setting of the layout of the substrate 2 based on the layout of the pattern-forming regions on the substrate 2 (allocation of the pattern-forming regions of the substrate 2). In addition, the control unit 40 calculates the area of a target pattern formation region where a pattern is to be formed from the layout information of the pattern-forming regions and the beginning timing of the aligning may be set for each pattern-forming region based on the area.

In addition, FIG. 3 also exemplifies the beginning timing of the aligning in each pattern-forming region if the aligning of the pattern-forming region of the second classification is determined to be begun in parallel with the flattening during the flattening. P in FIG. 3 indicates a pattern-forming region in which the aligning is set to be begun in parallel with the flattening. S in FIG. 3 indicates a pattern-forming region in which the aligning is set to be begun after the contacting (flattening).

Next, in S502, the control unit 40 controls the dispenser 16 and supplies the imprint material IM to the pattern-forming region of the substrate 2. Here, in the present treatment, a case where the imprint material IM is supplied to one pattern-forming region where a pattern is to be formed will be described. However, the configuration is not limited thereto and may be changed so that the imprint material IM is continuously supplied to a plurality of pattern-forming regions. In addition, the imprint material IM may have been supplied to all regions on the substrate 2 in advance, and, in this case, the treatment of S502 is omitted.

Next, in S503, the control unit 40 controls the relative driving mechanism, the pattern portion PP and the imprint material IM on the pattern-forming region are contacted with each other, and a pressure is applied between the mold 1 and the pattern-forming region to widen the contact area between the mold 1 and the imprint material IM (pressing).

Next, in S504, the control unit 40 determines whether or not the aligning and the flattening are set to be performed in parallel in the pattern-forming region on which the pressing has been performed in S503 based on the beginning timing of the aligning determined in S501. As a result of the determination, if the beginning timing of the aligning is set to be present during the period of the flattening, that is, the aligning is set to be begun in parallel with the flattening, the process proceeds to S505. On the other hand, if the beginning timing of the aligning is not present during the period of the flattening, that is, the aligning is not begun in parallel with the flattening, the process proceeds to S506. If the process proceeds to S506 as described above, the aligning has been determined to be begun after the flattening.

Next, in S505, the flattening and the aligning are begun in parallel. S505 includes S505-1 and S505-2. Here, S505-1 is flattening for decreasing the pressure that is acting on the second surface S2 so that the diaphragm 110 of the mold 1 forms a protruding shape toward the substrate 2 by controlling the pressure control mechanism 20 with the control unit 40. S505-2 is aligning for performing relative aligning between the mold 1 and the pattern-forming region based on the positional relationship between the mold 1 and an alignment mark in each pattern-forming region by controlling the relative driving mechanism with the control unit 40. Here, the beginning timing of the aligning is any timing during the period where the flattening is performed (decompressing). For example, the aligning may begin after a timing at which the flattening has begun or may be set to begin together with the beginning timing of the flattening.

In the aligning of S505-2, the treatment may be ended before the flattening ends if the relative positions have converged to a permissible range. However, even when the relative positions between the mold 1 and the substrate 2 have temporarily converged to a permissible range during the period of the flattening, disturbance by the flattening is still acting, while the degree is small, and thus it is desirable to continue the treatment at least until the flattening ends. In addition, it is also desirable to continue the treatment until the relative positions of the mold 1 and the substrate 2 converge to a permissible range even after the period of the flattening. In addition, even after the relative positions converge to a permissible range, the relative positions are controlled to be maintained.

Next, in S506, the control unit 40 controls the pressure control mechanism 20, and the pressure that is acting on the second surface S2 so that the diaphragm 110 of the mold 1 forms a protruding shape toward the substrate 2 is decreased (flattening). The treatment of S506 is the same treatment as the treatment of S505-1.

Next, in S507, the control unit 40 controls the relative driving mechanism, and relative aligning between the mold 1 and the pattern-forming region is performed based on the positional relationship between the mold 1 and the alignment mark in each pattern-forming region (aligning). The treatment of S507 is the same treatment as the treatment of S505-2.

Next, in S508, the control unit 40 controls the irradiation portion 12, and the imprint material M on the pattern-forming region is irradiated with irradiation light to cure the imprint material IM (curing). Next, in S509, the control unit 40 controls the relative driving mechanism to pull the mold 1 apart from the imprint material IM (mold releasing).

The above-described treatments of S501 through S509 are performed on all pattern-forming regions that are pattern formation targets on the substrate 2. Therefore, a pattern composed of a cured product of the imprint material IM is formed on the substrate 2.

As described above, in the imprint apparatus 100 and the imprinting method of Present Embodiment, it is possible to change the timings of beginning the aligning relative to the contacting depending on the area where a pattern can be formed in the plurality of pattern-forming regions. This makes it possible to perform the flattening and the aligning in parallel depending on the area where a pattern can be formed in the pattern-forming regions, and thus it is possible to shorten the treatment time of the entire imprinting treatment and to improve the throughput.

In Present Embodiment, pattern-forming regions are identified as three classifications depending on the area where a pattern can be formed, and the timing of beginning the aligning relative to the contacting is changed based on the classification. Here, the plurality of pattern-forming regions may be classified into at least two types.

Upon classifying the pattern-forming regions into two types, for example, regions where all or a predetermined value or more of the area of the pattern formed on the pattern portion PP can be formed are classified as a first classification, and regions where less than the predetermined value of the area of the pattern formed on the pattern portion PP can be formed are classified as a second classification. That is, regions are divided into full field regions and non-full field regions. In addition, in this case, if the first classification, the aligning begins during the period of the flattening, and, if the second classification, the aligning begins after the flattening is completed. Even when regions are classified into two types of full field regions and non-full field regions, it is possible to shorten the treatment time of the entire imprinting treatment and to improve the throughput in the same manner as described above.

In addition, the beginning timing of the aligning may be determined based on the proportion of the area of the pattern in the pattern-forming region without performing the above-described classification. That is, if the area of the pattern in the pattern-forming region is a predetermined value or more, the aligning may be set to begin during the period of the flattening, and, if the area of the pattern in the pattern-forming region is less than the predetermined value, the aligning may be set to begin after the flattening is completed.

Embodiment of Article Manufacturing Method

An article manufacturing method according to the present example is suitable for manufacturing articles, for example, microdevices such as semiconductor devices, elements having a fine structure and the like. The article manufacturing method according to the present example includes forming a pattern on a composition applied onto a substrate using the imprint apparatus 100 (performing a treatment on the substrate) and processing the substrate on which the pattern has been formed in the forming. Furthermore, such a manufacturing method includes other well-known steps (oxidation, film formation, vapor deposition, doping, flattening, etching, composition stripping, dicing, bonding, packaging and the like). The article manufacturing method according to the present example is advantageous in terms of at least one of the performance, quality, productivity and production cost of articles compared with conventional methods.

A pattern of a cured product molded using the imprint apparatus 100 is used permanently in at least a part of a variety of articles or temporarily at the time of manufacturing a variety of articles. The article is an electric circuit element, an optical element, MEMS, a recording element, a sensor, a mold or the like. Examples of the electric circuit element include volatile or non-volatile semiconductor memories such as DRAM, SRAM, flash memory and MRAM, semiconductor elements such as LSI, CCD, an image sensor and FPGA and the like. Examples of the mold include a mold for a substrate treatment such as imprinting and the like.

The pattern of the cured product is used as it is as a configuration member of at least a part of the article or temporarily used as a composition mask. After etching, ion implantation or the like is performed in the processing of the substrate, the composition mask is removed.

Figure 6A:
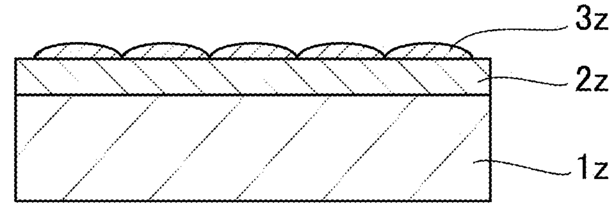
FIG. 6A to FIG. 6F are schematic views for describing an article manufacturing method.

Next, a specific article manufacturing method will be described with reference to FIG. 6. As shown in FIG. 6A, a substrate 1*z*, such as a silicon substrate, having a workpiece 2*z*, such as an insulator, formed on the surface is prepared, and subsequently, a composition 3*z* is imparted to the surface of the workpiece 2*z* by an inkjet method or the like.

Here, an appearance of the composition 3*z* forming a shape of a plurality of liquid droplets imparted on the substrate 1*z* is shown.

Figure 6B:
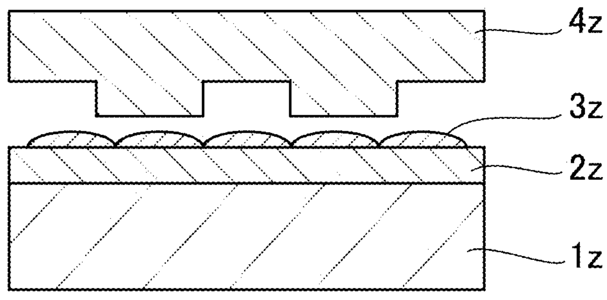
Figure 6C:
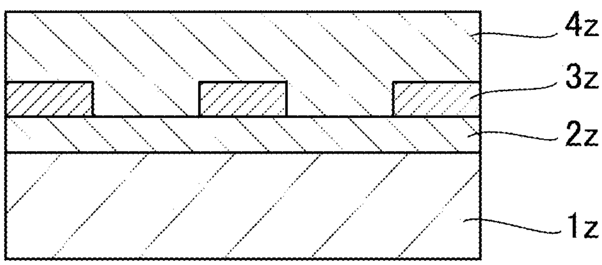

As shown in FIG. 6B, a mold 4*z* is made to face the composition 3*z* on the substrate 1*z* with a side having an uneven pattern formed thereon facing the composition 3*z*. As shown in FIG. 6C, the substrate 1*z* onto which the composition 3*z* has been imparted and the mold 4*z* are contacted with each other, and a pressure is applied (contacting). A gap between the mold 4*z* and the workpiece 2*z* is filled with the composition 3*z*. When irradiated with light, which is energy for curing, through the mold 4*z* in this state, the composition 3*z* cures (curing). At this time, in the present example, it becomes possible to irradiate the composition with the light at an irradiation level at which the degree of photopolymerization becomes optimal based on spectral sensitivity acquired in the apparatus.

Figure 6D:
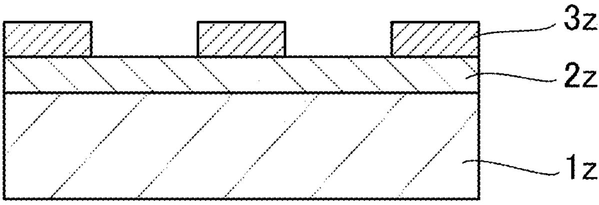

As shown in FIG. 6D, when the mold 4*z* and the substrate 1*z* are pulled apart after the composition 3*z* is cured, a pattern of the cured product of the composition 3*z* is formed on the substrate 1*z* (pattern forming and molding). This pattern of the cured product forms a shape in which recess portions of the mold 4*z* correspond to protruding portions of the cured product and protruding portions of the mold 4*z* correspond to recess portions of the cured product, that is, the uneven pattern of the mold 4*z* has been transferred to the composition 3*z*.

Figure 6E:
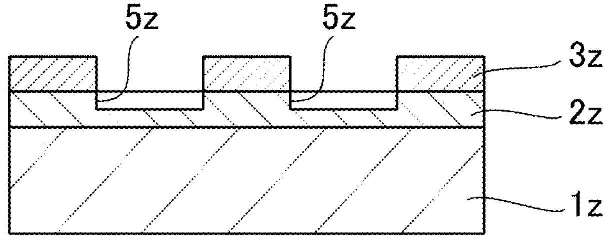
Figure 6F:
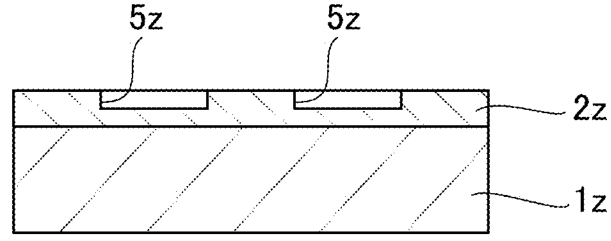

As shown in FIG. 6E, when etching is performed using the pattern of the cured product as an anti-etching mask, on the surface of the workpiece 2*z*, portions where the cured product is absent or thinly remains are removed, and grooves 5*z* are formed. As shown in FIG. 6F, when the pattern of the cured product is removed, an article having the grooves 5*z* formed on the surface of the workpiece 2*z* can be obtained. Here, the pattern of the cured product is removed, but may not be removed even after processing and may be used as a film for interlayer insulation, which is included in semiconductor elements and the like, that is, a configuration member of an article. An example where a mold for transferring a circuit pattern provided with an uneven pattern is used as the mold 4*z* has been described, but the mold may be a planar template having a planar portion with no uneven pattern.

Hitherto, the preferable embodiment of the present invention has been described, but the present invention is not limited to this embodiment and can be modified or changed in a variety of manner within the scope of the gist. In addition, the above-described embodiments may be performed in combination.

In addition, for a part or all of the controls in each example described above, a computer program configured to realize the function of each example described above may be supplied to the imprint apparatus 100 or the like through a network or a variety of storage media. In addition, a computer (or CPU, MPU or the like) in the imprint apparatus 100 or the like may be made to read and execute the program. In such a case, the program and a storage medium in which the program is stored configure the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-126391, Aug. 8, 2022, which is hereby incorporated by reference wherein in its entirety.

What is claimed is:

1. An imprinting method for forming a pattern of an imprint material in a plurality of pattern-forming regions on a substrate using a mold having a pattern portion, the method comprising:

contacting the mold and the imprint material to bring the pattern portion into contact with a pattern-forming region of the plurality of pattern-forming regions, pressing the contacted pattern portion and the imprint material on the pattern-forming region by applying a pressure between the mold and the pattern-forming region to widen a contact area between the mold and the imprint material in the pattern-forming region, and decompressing the contacted pattern portion by decreasing the pressure between the mold and the pattern-forming region to put at least the contacted pattern portion into a flat state after the pressing is completed; and relatively aligning the mold and the pattern-forming region based on a positional relationship between the mold and an alignment mark of the pattern-forming region, wherein, in the aligning, a timing of beginning the aligning is determined based on whether a variation in relative positions between the mold and the pattern-forming region during the decompressing is within a permissible range, such that the aligning begins during a period of the decompressing if an area in the pattern-forming region where the pattern can be formed is a second area corresponding to a full field region having a contour that is not limited by the edge of the substrate, the second area being wider than a first area corresponding to a partial field region having a contour that is limited by an edge of the substrate.

2. The imprinting method according to claim 1, wherein a timing of beginning the contacting is ahead of the timing of beginning the aligning.

3. The imprinting method according to claim 1, wherein the aligning is changed to begin after the decompressing is completed or during a period of the decompressing depending on an area in the plurality of pattern-forming regions where the pattern can be formed.

4. The imprinting method according to claim 3, wherein the aligning begins during a period of the decompressing if a proportion of an area of the pattern in the pattern-forming region is a predetermined value or more.

5. The imprinting method according to claim 3, wherein the aligning begins after the decompressing is completed if the proportion of the area of the pattern in the pattern-forming region is less than the predetermined value.

6. The imprinting method according to claim 1, wherein the aligning begins during a period of the decompressing if at least a deviation between a central portion of the pattern portion and a central region in an effective area of the pattern-forming region is less than a predetermined threshold value when the pattern portion has been contacted to the imprint material.

7. The imprinting method according to claim 1, wherein the aligning begins after the decompressing is completed if at least a deviation between a central portion of the pattern portion and a central region in an effective area of the pattern-forming region is a predetermined threshold value or more when the pattern portion has been contacted to the imprint material.

8. An article manufacturing method, comprising:

pattern-forming of forming a pattern on a substrate using an imprint apparatus having:

a moving unit configured to relatively move a mold and the substrate so that a pattern portion of the mold is contacted to an imprint material on a pattern-forming region;

a pressing unit configured to press the contacted pattern portion and the imprint material on the pattern-forming region by applying a pressure between the mold and the pattern-forming region to widen a contact area between the mold and the imprint material in the pattern-forming region, and decompress the contacted pattern portion by decreasing the pressure between the mold and the pattern-forming region to put at least the contacted pattern portion into a flat state after the pressing is completed; and a control unit configured to control the moving unit so that the mold and the pattern-forming region are relatively aligned based on a positional relationship between the mold and an alignment mark of the pattern-forming region, in which the control unit is further configured to determine a timing of beginning the aligning between the mold and the pattern-forming region based on whether a variation in relative positions between the mold and the pattern-forming region during the decompressing is within a permissible range, such that the aligning begins during a period of the decompressing if an area in a pattern-forming region where the pattern can be formed is a second area corresponding to a full field region having a contour that is not limited by the edge of the substrate, the second area being wider than a first area corresponding to a partial field region having a contour that is limited by an edge of the substrate;

processing the substrate on which the pattern is formed in the pattern-forming; and manufacturing an article from the substrate processed in the processing.

* * * * *